United States Patent
Roehrer et al.

(10) Patent No.: US 11,039,515 B2
(45) Date of Patent: *Jun. 15, 2021

(54) LIGHT EMITTING SEMICONDUCTOR DEVICE FOR GENERATION OF SHORT LIGHT PULSES

(71) Applicant: ams AG, Premstaetten (AT)

(72) Inventors: Georg Roehrer, Premstaetten (AT); Robert Kappel, Premstaetten (AT); Nenad Lilic, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/633,288

(22) PCT Filed: Jul. 18, 2018

(86) PCT No.: PCT/EP2018/069548
§ 371 (c)(1),
(2) Date: Jan. 23, 2020

(87) PCT Pub. No.: WO2019/020469
PCT Pub. Date: Jan. 31, 2019

(65) Prior Publication Data
US 2020/0154544 A1      May 14, 2020

(30) Foreign Application Priority Data
Jul. 26, 2017 (EP) ..................... 17183335

(51) Int. Cl.
*H05B 45/30* (2020.01)
*H05B 45/32* (2020.01)
(Continued)

(52) U.S. Cl.
CPC ........... *H05B 45/32* (2020.01); *H01L 25/167* (2013.01); *H01L 31/02005* (2013.01);
(Continued)

(58) Field of Classification Search
CPC ........... H05B 33/0815; H05B 33/0824; H05B 33/0878; H05B 45/30; H05B 45/32;
(Continued)

(56) References Cited

U.S. PATENT DOCUMENTS 4,473,834 A * 9/1984 Soclof ................. H01L 33/0016
257/100
5,739,717 A * 4/1998 Nakamura ............. G11B 7/126
327/514

(Continued)

FOREIGN PATENT DOCUMENTS

DE 3722704    1/1989
EP 2661034   11/2013
(Continued)

OTHER PUBLICATIONS

European Patent Office, International Search report for PCT/EP2018/069548 dated Aug. 9, 2018.
(Continued)

*Primary Examiner* — Tung X Le
(74) *Attorney, Agent, or Firm* — MH2 Technology Law Group LLP (57) ABSTRACT

The device comprises a bipolar transistor with emitter, base, collector, base-collector junction and base-emitter junction, a collector-to-base breakdown voltage, a quenching component electrically connected with the base or the collector, and a switching circuitry configured to apply a forward bias to the base-emitter junction. The bipolar transistor is configured for operation at a reverse collector-to-base voltage above the breakdown voltage.

14 Claims, 6 Drawing Sheets

(51) Int. Cl.
*H01L 25/16* (2006.01)
*H01L 31/02* (2006.01)
*H01L 31/0232* (2014.01)
*H01L 33/00* (2010.01)
*H01L 33/14* (2010.01)
*H01L 33/58* (2010.01)
*H01L 33/62* (2010.01)

(52) U.S. Cl.
CPC .... *H01L 31/02327* (2013.01); *H01L 33/0016* (2013.01); *H01L 33/14* (2013.01); *H01L 33/58* (2013.01); *H01L 33/62* (2013.01)

(58) Field of Classification Search
CPC ... H05B 41/282; H05B 41/2824; H01L 33/08; H01L 33/18; H01L 33/20
USPC .................................... 315/186, 193; 257/79
See application file for complete search history.

(56) References Cited

U.S. PATENT DOCUMENTS

| | | | | |
|---|---|---|---|---|
| 6,121,640 | A * | 9/2000 | Leonardi | H01L 27/0635 257/137 |
| 6,365,951 | B1 | 4/2002 | Worley | |
| 7,846,066 | B1 * | 12/2010 | Chuang | A63B 21/227 482/1 |
| 2004/0197046 | A1 | 10/2004 | Drost et al. | |
| 2007/0171946 | A1 * | 7/2007 | Hase | H01S 5/06832 372/29.02 |
| 2008/0116465 | A1 * | 5/2008 | Moon | H01L 33/0004 257/79 |
| 2010/0013458 | A1 | 1/2010 | Lany et al. | |
| 2010/0194274 | A1 * | 8/2010 | Hoogzaad | H05B 45/00 315/51 |
| 2012/0032228 | A1 * | 2/2012 | Sawahata | H01L 29/7436 257/173 |
| 2015/0028764 | A1 * | 1/2015 | Maru | H05B 47/10 315/210 |
| 2016/0057832 | A1 * | 2/2016 | Briggs | G01R 19/0092 315/134 |
| 2016/0242258 | A1 * | 8/2016 | Agarwal | H05B 45/50 |

FOREIGN PATENT DOCUMENTS

| | | |
|---|---|---|
| JP | H04-23610 | 1/1992 |
| JP | 2007-042731 | 2/2007 |
| WO | 2011/038422 | 3/2011 |

OTHER PUBLICATIONS

Barillaro, G. et al.: "Integrated porous-silicon light-emitting diodes: A fabrication process using graded doping profiles", AIP Applied Physics Letter; 78 (26): 4154 (2001).

Khanmohammadi et Al.: Monolithically Integrated Optical Random Pulse Generator in High Voltage CMOS Technology, IEEE pp. 138-141 (2015.

* cited by examiner

LIGHT EMITTING SEMICONDUCTOR DEVICE FOR GENERATION OF SHORT LIGHT PULSES

The present disclosure is related to light emitting semiconductor devices.

BACKGROUND OF THE INVENTION

A variety of light emitting semiconductor devices have been developed for various applications to satisfy an increasing demand for compact light sources. While many light emitting devices are intended for a permanent emission of radiation, it is also desirable to have semiconductor devices that are able to generate very short light pulses having a duration of less than 1 nanosecond.

SUMMARY OF THE INVENTION

The definitions as described above also apply to the following description unless stated otherwise.

The light emitting semiconductor device comprises a bipolar transistor with emitter, base, collector, base-collector junction and base-emitter junction, a quenching component electrically connected with the base or the collector, and a switching circuitry configured to apply a forward bias to the base-emitter junction. The bipolar transistor is configured for operation at a reverse collector-to-base voltage above the breakdown voltage. The bipolar transistor is configured for the generation of short light pulses. The term "light" is here used in the sense of electromagnetic radiation. The wavelength is not restricted to the visible spectrum.

In particular, the bipolar transistor is a vertical bipolar transistor. During operation of a vertical bipolar transistor, electric current across the base region flows in the direction normal to the main surface of the semiconductor substrate or wafer of the device. The current flow may additionally have a lateral component parallel to the main surface.

In an embodiment of the light emitting semiconductor device, the switching circuitry is configured to enable an electric connection of the emitter alternatively with a ground potential and with a further voltage, which is provided for triggering an avalanche breakdown.

A further embodiment comprises a first capacitor connected to the emitter, and the switching circuitry is configured to enable the first capacitor to be charged to a capacitor voltage and to be discharged through the emitter for triggering an avalanche breakdown.

A further embodiment comprises a second capacitor connected in parallel with the quenching component.

A further embodiment comprises a third capacitor connected between the collector and the base.

In further embodiments the quenching component comprises a resistor or a transistor.

In a further embodiment the quenching component is an active quenching circuit.

A further embodiment comprises a first device component including a bipolar light emitter, which is formed by the bipolar transistor, the quenching component and the switching circuitry, and a light detector, and a second device component including a further bipolar light emitter and a further light detector. The first and second device components are arranged so that the bipolar light emitter is opposite the further light detector and the further bipolar light emitter is opposite the light detector.

A further embodiment comprises an intermetal dielectric forming part of the first device component, and metallization layers embedded in the intermetal dielectric. The metallization layers form an optical confinement of a light emitting area of the bipolar light emitter.

A further embodiment comprises a further intermetal dielectric forming part of the second device component, the intermetal dielectric being connected to the further intermetal dielectric, and further metallization layers embedded in the further intermetal dielectric. The further metallization layers form a further optical confinement of a light receiving area of the further light detector.

In a further embodiment the metallization layers form a further optical confinement of a light receiving area of the light detector, and the further metallization layers form a further optical confinement of a further light emitting area of the further bipolar light emitter.

A further embodiment comprises a substrate of semiconductor material, the substrate having a main surface, a shallow well of a first type of conductivity in a deep well of an opposite second type of conductivity in the substrate, a doped region of the second type of conductivity in the shallow well at the main surface, a p-n junction between the doped region and the shallow well, a junction-forming region arranged in the deep well under the shallow well, the junction-forming region having a doping concentration for the second type of conductivity, the doping concentration of the junction-forming region being higher than a doping concentration of the deep well outside the junction-forming region, and a further p-n junction between the junction-forming region and the shallow well. The p-n junction and the further p-n junction form a bipolar light emitter generating light pulses by a current or voltage across the p-n junction when the further p-n junction is reverse biased above a breakdown voltage.

A further embodiment comprises a shallow well contact region of the first type of conductivity in the shallow well at the main surface, the shallow well contact region having a doping concentration that is higher than a doping concentration of the shallow well. The doped region is arranged at a distance from the shallow well contact region.

A further embodiment comprises a deep well contact region of the second type of conductivity in the deep well at the main surface, the deep well contact region having a doping concentration that is higher than a doping concentration of the deep well.

BRIEF DESCRIPTION OF THE DRAWINGS

The following is a detailed description of examples of the light emitting semiconductor device in conjunction with the appended figures.

DETAILED DESCRIPTION

Figure 1:
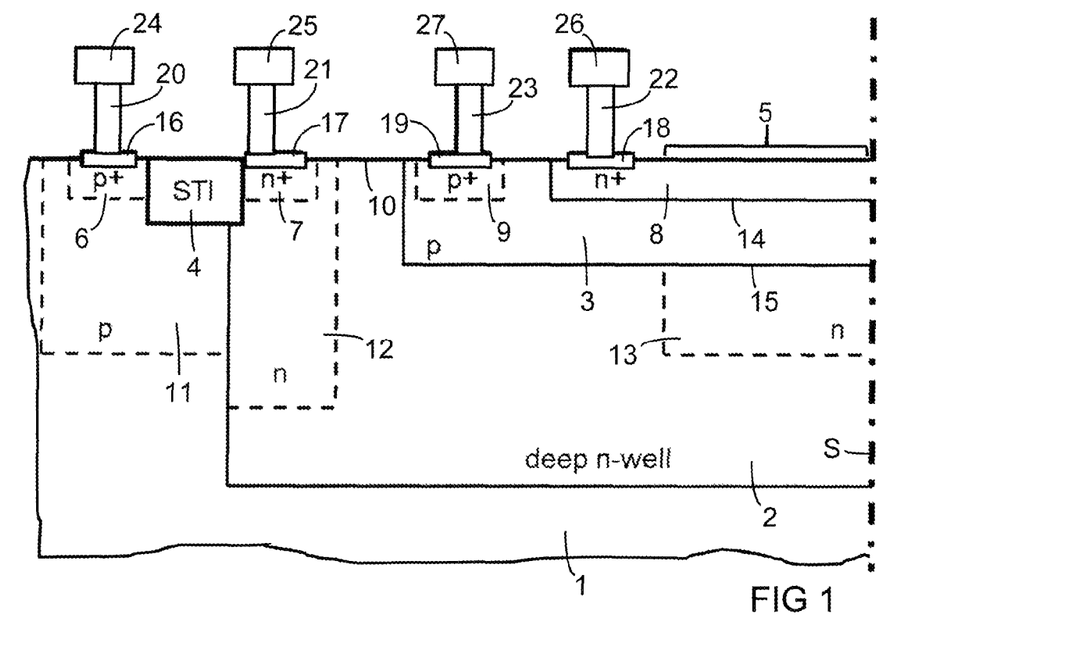
FIG. 1 is a partial cross section of a bipolar light emitter.

FIG. 1 is a partial cross section of a bipolar light emitter comprising a bipolar transistor that is configured to be operated with a quenching component at a collector-to-base voltage exceeding the breakdown voltage. The bipolar light emitter comprises a substrate 1 of semiconductor material, which may be silicon, for instance.

Doped regions in the substrate 1 have a first type of conductivity or an opposite second type of conductivity. The first type of conductivity may be p-type conductivity, so that the second type of conductivity is n-type conductivity, as indicated in the figures by way of example. The types of conductivity may be reversed. Doping concentrations for either type of conductivity that are sufficiently high for the formation of ohmic contacts on the semiconductor material are respectively indicated by p+ and n+.

The substrate 1 may be intrinsically doped or have a low doping concentration for the first type of conductivity. At a main surface 10 of the substrate 1, a shallow well 3 of the first type of conductivity is located in a deep well 2 of the second type of conductivity. An isolation region 4, which may be a shallow trench isolation, for instance, can be present where a lateral boundary of the deep well 2 reaches the main surface 10.

A substrate contact region 6, which has a high doping concentration for the first type of conductivity, may be provided if an electric connection of the substrate 1 is desired. The substrate contact region 6 is formed at the main surface 10 and may be arranged in a substrate region 11, which has a doping concentration for the first type of conductivity yielding an electric conductivity that is higher than the basic conductivity of the substrate 1.

A deep well contact region 7, which has a high doping concentration for the second type of conductivity, is provided for an electric connection of the deep well 2. The deep well contact region 7 is formed at the main surface 10 and may be arranged in a well region 12, which has a doping concentration for the second type of conductivity yielding an electric conductivity that is higher than the basic conductivity of the deep well 2.

A doped region 8, which has a high doping concentration for the second type of conductivity, is arranged at the main surface 10 in the shallow well 3. A shallow well contact region 9, which has a high doping concentration for the opposite first type of conductivity, is provided for an electric connection of the shallow well 3 and is also arranged at the main surface 10 in the shallow well 3, at a small distance from the doped region 8.

A p-n junction 14 is formed between the doped region 8 and the shallow well 3. A special region, which will be referred to as junction-forming region 13, is present in the deep well 2 under the shallow well 3, where a further p-n junction 15 is formed between the junction-forming region 13 and the shallow well 3. The junction-forming region 13 has an elevated doping concentration for the second type of conductivity at least at the further p-n junction 15 and is thus suitable for an avalanche multiplication of charge carriers.

In particular, the bipolar transistor is a vertical bipolar transistor. The deep well 2 provides the collector, the shallow well 3 provides the base, and the doped region 8 provides the emitter of the bipolar transistor. The deep well 2 has a region that reaches deeper into the substrate 1 than the shallow well 3. The junction-forming region 13 especially is a region of the deep well 2 that is arranged below the shallow well 3. Thus the distance of the junction-forming region 13 from the main surface 10 is larger than the distance of the shallow well 3 from the main surface 10. Hence the movement of charge carriers of an electric current through the shallow well 3 and the p-n junction 30 has a component in the direction normal to the main surface 10.

In the light emitting semiconductor device shown in FIG. 1, the area of the p-n junction 14 is larger than the area of the further p-n junction 15. The light emitting semiconductor device may be symmetrical with respect to an optional symmetry axis S, which is indicated in FIG. 1 by the vertical broken line. The device need not be symmetrical.

The high doping concentrations of the regions 6, 7, 8, 9 enable to form ohmic contacts between the semiconductor material and electrically conductive contact layers. In the described examples, the contact layers are provided by optional silicide layers 16, 17, 18, 19. Contact plugs 20, 21, 22, 23 may be arranged in a dielectric layer, in particular an intermetal dielectric of a wiring, for instance. Such a dielectric layer is known per se in semiconductor technology, in particular standard CMOS technology, and not shown in the figures.

The contact plugs 20, 21, 22, 23 electrically connect the contact layers 16, 17, 18, 19 to respective conductor layers 24, 25, 26, 27, which may be conductor tracks in a structured metallization level of a wiring, for instance. If the silicide layers 16, 17, 18, 19 are not provided, the contact plugs 20, 21, 22, 23 can be applied directly on the regions 6, 7, 8, 9.

Light is mainly emitted from the region where the further p-n junction 15 is formed by the junction-forming region 13, if the applied reverse voltage exceeds the breakdown voltage. The light emitting area 5 corresponds roughly to the area where the reverse voltage exceeds the breakdown voltage. An enlarged parasitic capacitance, which is provided by the region where the junction-forming region 13 is not present under the shallow well 3, increases the charge discharged through the device and hence light intensity. The conductor layers 24, 25, 26, 27 are arranged in such a manner that the light emitting area 5 is not shielded by the conductor layers 24, 25, 26, 27.

Figure 2:
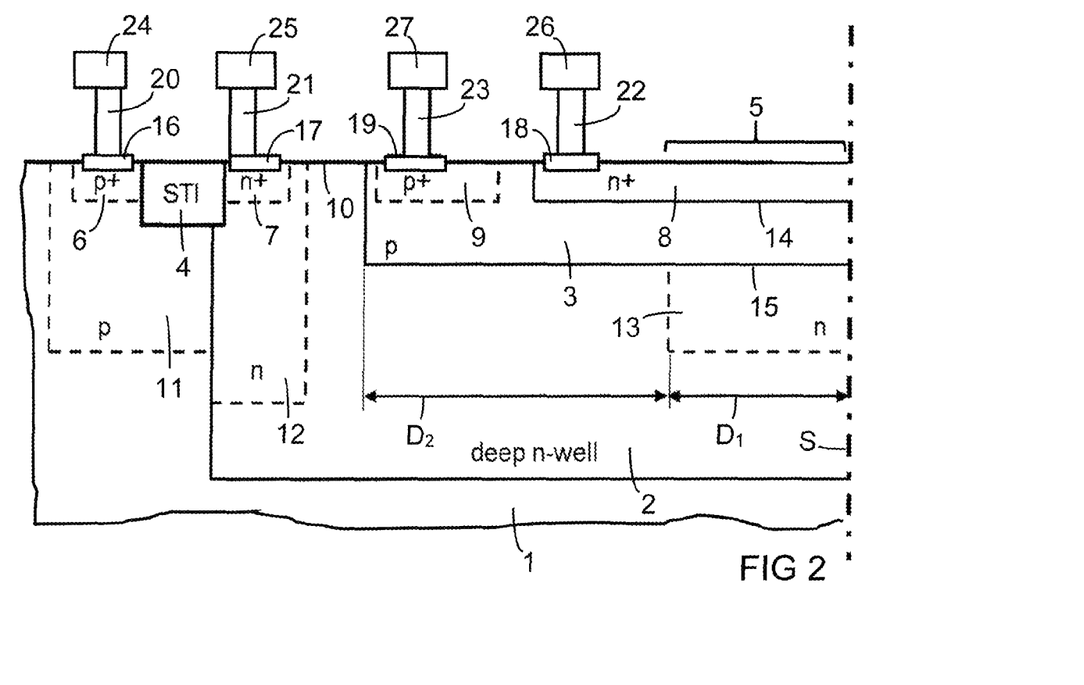
FIG. 2 is a partial cross section of a further bipolar light emitter.

FIG. 2 is a partial cross section of a further bipolar light emitter. Elements of the bipolar light emitter according to FIG. 2 corresponding to elements of the bipolar light emitter according to FIG. 1 are designated with the same reference numerals. FIG. 2 shows that the dimension of the light emitting area 5 is essentially the same as the first dimension $D_1$ of the region where the further p-n junction 15 is present. In particular, the bipolar transistor is a vertical bipolar transistor, as described above in conjunction with FIG. 1. The second dimension $D_2$ of the region where the junction-forming region 13 is not present under the shallow well 3 is larger than in the bipolar light emitter according to FIG. 1. The larger second dimension $D_2$ increases the capacitance of the base-collector junction. When the bipolar light emitter is triggered, the base-collector junction is discharged until the breakdown voltage is reached. The increased capacitance of the base-collector junction causes an increased total flow of charge carriers through the bipolar light emitter. Hence the intensity of the light emitted by the device is increased.

Figure 3:
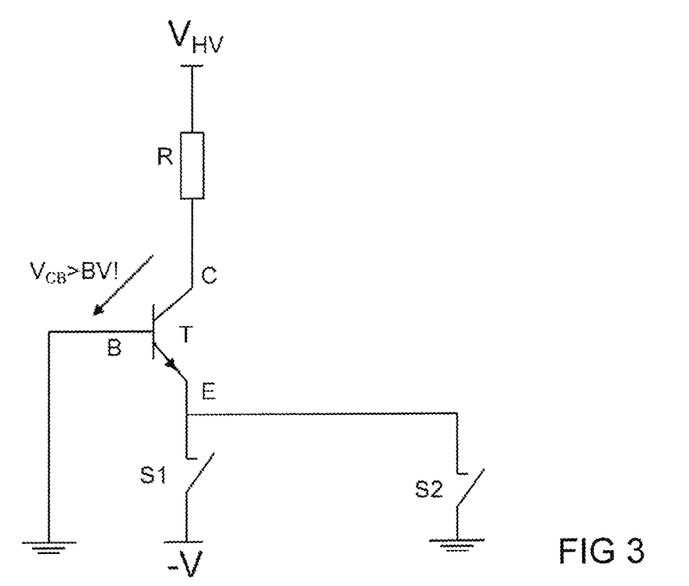
FIG. 3 shows a circuit diagram of a light emitting semiconductor device.

FIG. 3 shows a circuit diagram for an embodiment of the light emitting semiconductor device. The components shown in the circuit diagram may be integrated in the same semiconductor chip. The device comprises a bipolar transistor T that is configured to be operated at a collector-to-base voltage exceeding the breakdown voltage of the base-collector junction. The bipolar transistor T may in particular be a bipolar light emitter according to FIG. 1 or 2. The collector is formed by the deep well 2, the contact layer 17 and the contact plug 21, the emitter is formed by the doped region 8, the contact layer 18 and the contact plug 22, and the base is formed by the shallow well 3, the contact layer 19 and the contact plug 23. The p-n junction 14 is the base-emitter junction, and the further p-n junction 15 is the base-collector junction.

The operation of the light emitting semiconductor device is based on the operation of a single-photon avalanche diode. Some form of quenching is required to inhibit a prolonged avalanche and to enable a quick recharging of the base-collector junction of the bipolar transistor. Because of the rapid quenching it is feasible to generate extremely short light pulses. The recharging time determines the minimum possible time interval between successive light pulses. The short recharging time that is achieved with this device allows a substantial increase of the rate of data transfer by means of the generated light pulses.

A quenching component can be connected to the base or to the collector. In the following description the quenching component is shown to be connected to the collector by way of example.

In the example shown in FIG. 3, the resistor R performs the quenching. The quenching component may instead be a transistor, for instance, or an active quenching circuit. An active quenching circuit allows to reduce the resistance to $V_{HV}$ during the recharge of the base-collector junction, and thus to obtain a shorter recharging time. Circuits that are suitable for active quenching are known per se and need not be described here.

In the device according to the circuit diagram of FIG. 3, the resistor R is connected between the collector C of the bipolar transistor T and a high voltage $V_{HV}$. The base B of the bipolar transistor T is connected with ground. Alternatively, the quenching component can be connected between the base B and ground. The circuit further comprises switches S1 and S2, which allow to connect the emitter E of the bipolar transistor T alternatively with the ground potential and with a further voltage −V, which is provided by an electric potential different from the ground potential. A typical switching sequence during operation of the device is: 1.) S1 is opened and S2 is closed; 2.) S2 is opened; 3.) S1 is closed (this triggers the avalanche breakdown).

Figure 4:
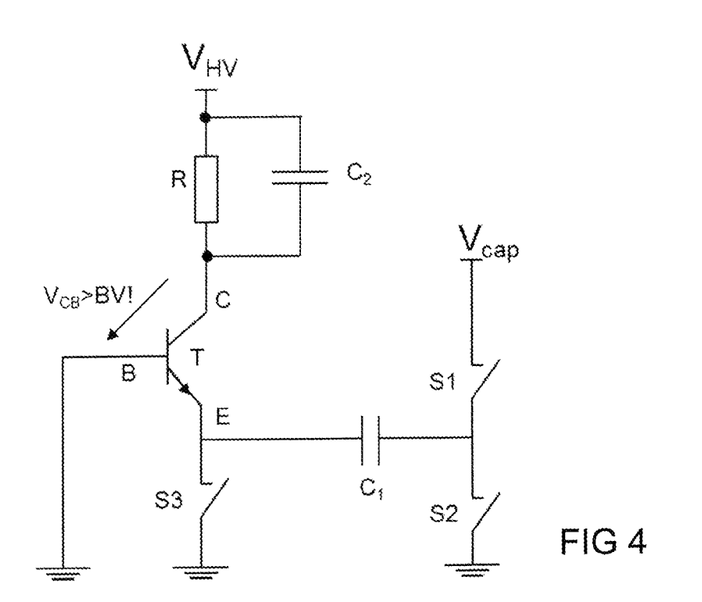
FIG. 4 shows a circuit diagram of a further light emitting semiconductor device.

FIG. 4 shows a circuit diagram of a further embodiment of the light emitting semiconductor device. The components shown in the circuit diagram may be integrated in the same semiconductor chip. The device comprises a bipolar transistor T that is configured to be operated at a reverse collector-to-base voltage exceeding the breakdown voltage of the base-collector junction. The bipolar transistor T may in particular be provided by a bipolar light emitter according to FIG. 1 or 2.

In the device according to FIG. 4, the emitter E of the bipolar transistor T is connected to a first capacitor $C_1$. A first switch S1, a second switch S2 and a third switch S3 allow to connect the capacitor $C_1$ between the ground potential and a dedicated capacitor voltage $V_{cap}$ or between the ground potential and the emitter E. A typical switching sequence during operation of the device is: 1.) S1 and S3 are closed to charge the first capacitor $C_1$ to $V_{cap}$; 2.) S1 and S3 are opened; 3.) S2 is closed, so that the first capacitor $C_1$ is discharged through the emitter E to trigger the avalanche breakdown.

Since a few electrons are sufficient to trigger the avalanche, a relatively small capacitance of the order of fF is sufficient for this purpose. After the avalanche has been triggered, the capacitor is recharged to $V_{cap}$ by opening the second switch S2 and closing the first switch S1 and the third switch S3.

FIG. 4 also shows that a capacitor can optionally be connected in parallel with the resistor R. This is the second capacitor $C_2$ in the circuit diagram shown in FIG. 4. Discharging through the base-collector junction is increased by the capacitance of the second capacitor $C_2$, so that the intensity of the emitted light is increased. This arrangement of the second capacitor $C_2$ has the advantage that the voltage requirements of the second capacitor $C_2$ are limited to the excess bias voltage (the reverse voltage exceeding the breakdown voltage of the base-collector junction). Alternatively, the quenching component comprising a resistor and a capacitor in parallel can be connected between the base B and ground. The second capacitor $C_2$ can be a separate device, or it can be integrated together with the other described components of the light emitting semiconductor device in the same semiconductor chip. A capacitor in parallel with the resistor R may also be provided in the device according to the circuit diagram of FIG. 3.

Figure 5:
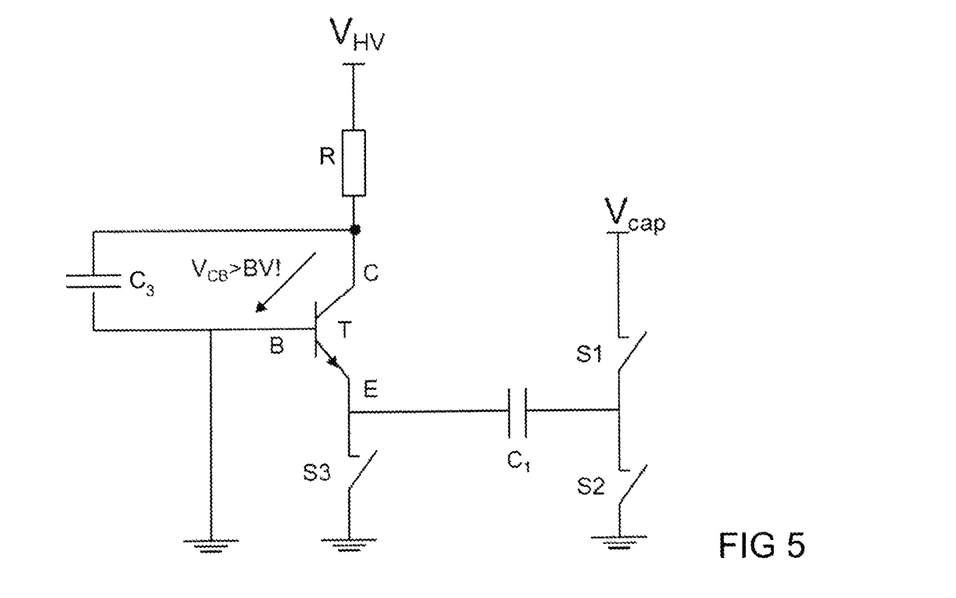
FIG. 5 shows a circuit diagram of a further light emitting semiconductor device.

FIG. 5 shows a circuit diagram of a further embodiment of the light emitting semiconductor device. In this further embodiment a third capacitor $C_3$ is connected between the collector C and the base B of the bipolar transistor T, so that the third capacitor $C_3$ is connected parallel to the base-collector junction. Discharging through the base-collector junction is increased by the capacitance of the third capacitor $C_3$, so that the intensity of the emitted light is increased. The third capacitor $C_3$ can be a separate device, or it can be integrated together with the other described components of the light emitting semiconductor device in the same semiconductor chip. In the devices according to FIGS. 1 and 2, the third capacitor $C_3$ can especially be provided by the region where the junction-forming region 13 is not present under the shallow well 3. A capacitor between the collector C and the base B of the bipolar transistor T may also be provided in the device according to the circuit diagram of FIG. 3. The quenching component, which is shown in FIG. 5 as a resistor, can alternatively be connected between the base B and ground.

Figure 6:
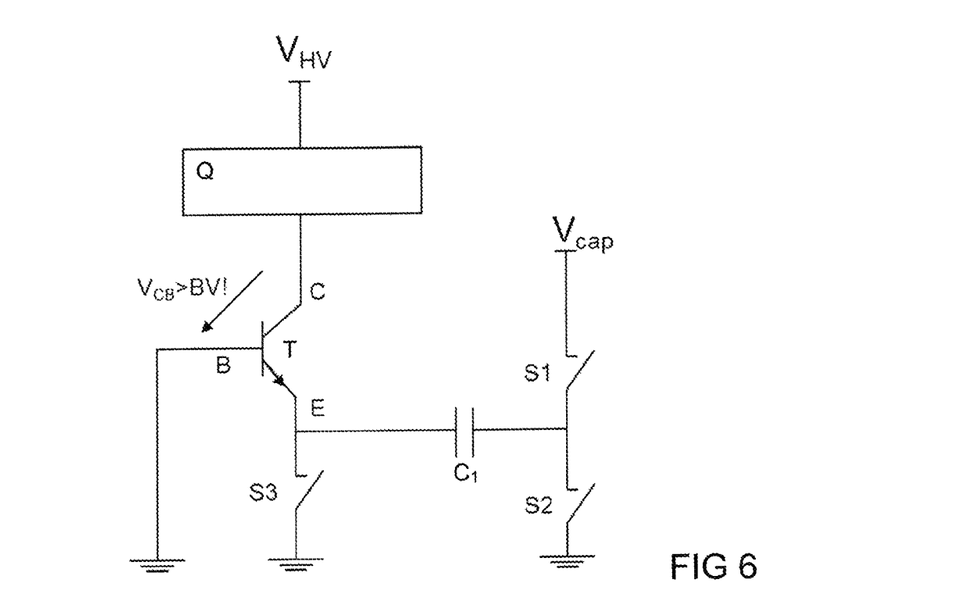
FIG. 6 shows a circuit diagram of a further light emitting semiconductor device.

FIG. 6 shows a circuit diagram of a further embodiment of the light emitting semiconductor device. The resistor R and the second capacitor $C_2$ are replaced with an active quenching circuit Q, which can be provided for active recharge. The active quenching circuit Q, which is connected between the collector C of the bipolar transistor T and the high voltage $V_{HV}$, allows to reduce the resistance to $V_{HV}$ during the recharge of the base-collector junction, and thus to obtain a shorter recharging time. This enables a higher repetition rate of light pulses. Alternatively, the active quenching circuit Q can be connected between the base B and ground.

Figure 7:
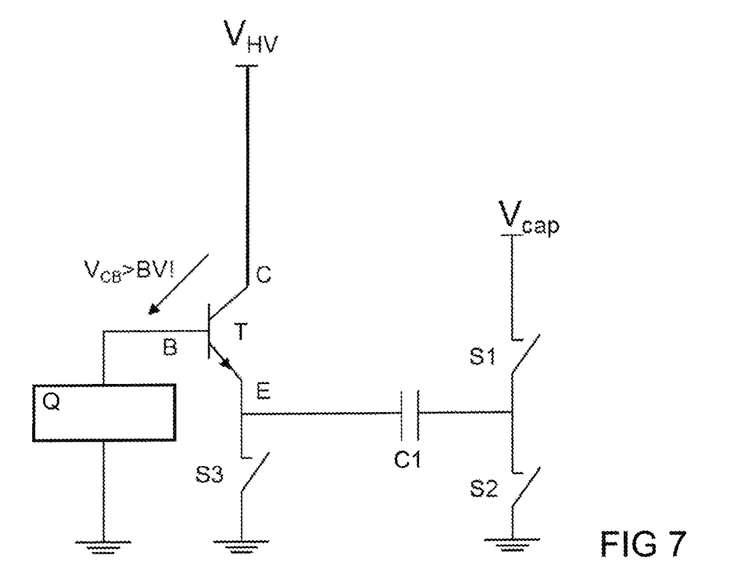
FIG. 7 shows a circuit diagram of a further light emitting semiconductor device.

FIG. 7 shows a circuit diagram of a further embodiment of the light emitting semiconductor device. The circuit shown in FIG. 7 differs from the circuit shown in FIG. 6 in that the quenching component Q is connected to the base B. This is a suitable alternative.

Figure 8:
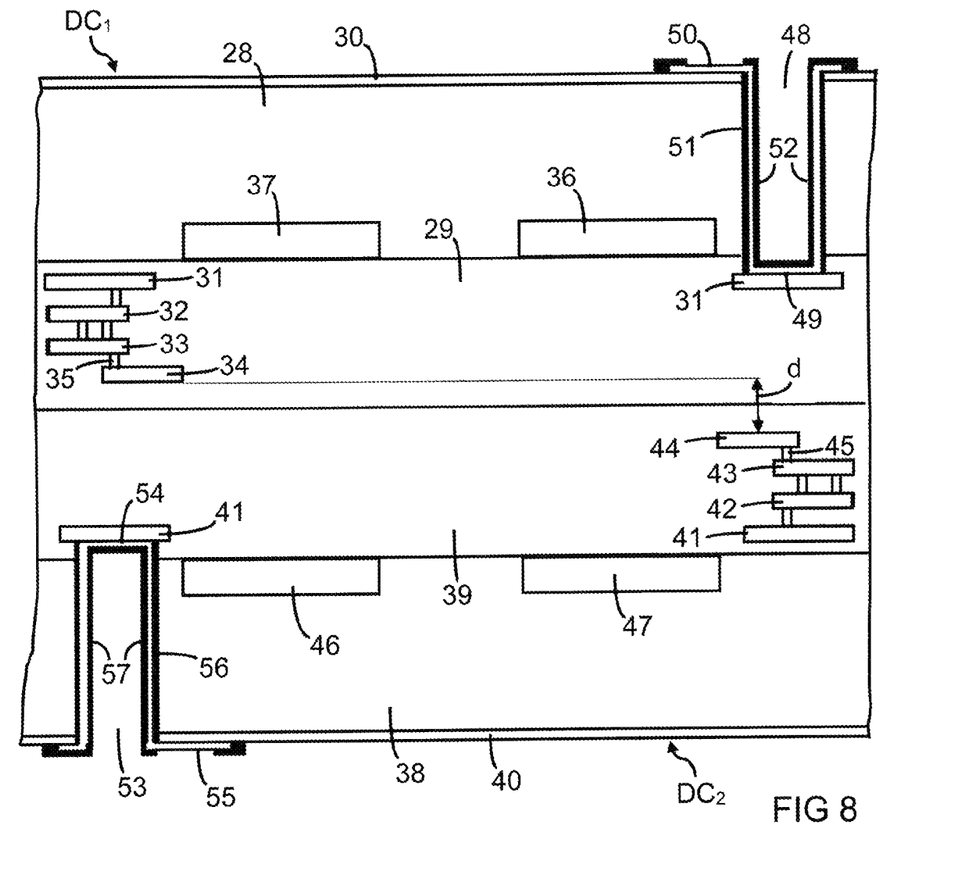
FIG. 8 is a partial cross section of a stacked light emitting semiconductor device.

FIG. 8 is a partial cross section of a stacked light emitting semiconductor device. A first device component $DC_1$ comprises a substrate 28 of semiconductor material, which may be similar to the substrate 1 shown in FIGS. 1 and 2, an intermetal dielectric 29 on a front surface of the substrate 28, and a dielectric layer 30 on an opposite rear surface. A second device component $DC_2$ comprises a further substrate 38 of semiconductor material, a further intermetal dielectric 39 on a front surface of the further substrate 38, and a further dielectric layer 40 on an opposite rear surface of the further substrate 38. The device components $DC_1$, $DC_2$ are bonded to one another by the dielectric layers 29, 39. A dedicated bonding layer is optionally provided between the dielectric layers 29, 39.

The first device component $DC_1$ further comprises a wiring including metallization levels, in particular a first metallization level 31, a second metallization level 32, a third metallization level 33, and a fourth metallization level 34 with vertical interconnections 35 in between. The second device component $DC_2$ comprises a further wiring including further metallization levels, in particular a further first metallization level 41, a further second metallization level 42, a further third metallization level 43, and a further fourth metallization level 44 with further vertical interconnections 45 in between. The number of metallization levels and the number of further metallization levels are arbitrary. Each metallization level comprises a structured metal layer.

The first device component $DC_1$ further comprises a bipolar light emitter 36 having a structure similar to one of the bipolar light emitters according to FIGS. 1 and 2, and a light detector 37. The bipolar light emitter 36 includes the p-n junction 14 and the further p-n junction 15. The second device component $DC_2$ comprises a further bipolar light emitter 46 having a structure similar to one of the bipolar light emitters according to FIGS. 1 and 2, and a further light detector 47. The light detectors 37, 47 may in particular be single-photon avalanche diode arrays, for instance, or any other type of photodetectors.

The bipolar light emitter 36 of the first device component $DC_1$ is arranged opposite the further light detector 47 of the second device component $DC_2$. The further bipolar light emitter 46 of the second device component $DC_2$ is arranged opposite the light detector 37 of the first device component $DC_1$. Light emitted from the bipolar light emitter 36 of the first device component $DC_1$ can thus be detected by the further light detector 47 of the second device component $DC_2$, and light emitted from the further bipolar light emitter 46 of the second device component $DC_2$ can be detected by the light detector 37 of the first device component $DC_1$.

The communication between the first device component $DC_1$ and the second device component $DC_2$ is effected with short light pulses that are emitted by the bipolar light emitters 36, 46 and received by the light detectors 37, 47. The intermetal dielectric 29, 39 is selected to be sufficiently transparent for the light pulses. The distance d between the metallization level 34 of the first device component $DC_1$ that is closest to a metallization level 44 of the second device component $DC_2$ can be made large enough for the required galvanic isolation between the device components $DC_1$, $DC_2$.

Through-substrate vias 48, 53 comprising a metallization layer 49, 54 may be provided for electric connection between the wiring and a contact pad 50, 55 at the rear surface. In the example shown in FIG. 8, the metallization layer 49 of the through-substrate via 48 of the first device component $DC_1$ is connected to a portion of the first metallization level 31 of the corresponding wiring, and the further metallization layer 54 of the further through-substrate via 53 of the second device component $DC_2$ is also connected to a portion of the further first metallization level 41 of the corresponding further wiring, by way of example.

The metallization layers 49, 54 of the through-substrate vias 48, 53 can be insulated from the semiconductor material of the substrates by dielectric layers 51, 56. Passivation layers 52, 57 may cover the metallization layers 49, 54 except for the areas of the contact pads 50, 55. The layers may include sequences of partial layers, and further layers may be provided, which are not shown in the figures.

Figure 9:
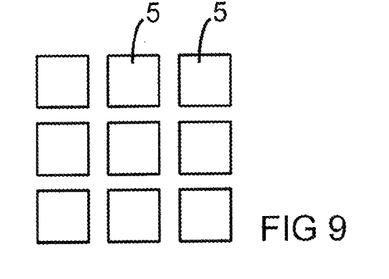
FIG. 9 is a top view of light emitting areas of the bipolar light emitters.
Figure 10:
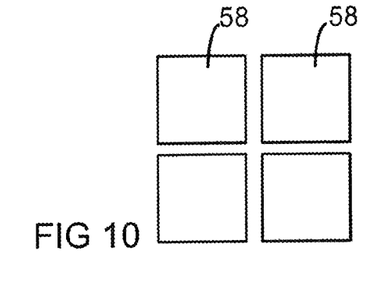
FIG. 10 is a top view of areas of single-photon avalanche diodes.

FIG. 9 shows an example of an array of individual light emitting areas forming the light emitting area 5 of the bipolar light emitter 36 of the first device component $DC_1$ and/or the light emitting area 59 of the bipolar light emitter 46 of the second device component $DC_2$. FIG. 10 shows an example of an array of individual light receiving areas forming the light receiving area 58 of the light detector 37 of the first device component $DC_1$ and/or the light detector 47 of the second device component $DC_2$. In this example the array of light emitting areas 5 is larger than the array of light receiving areas 58.

Figure 11:
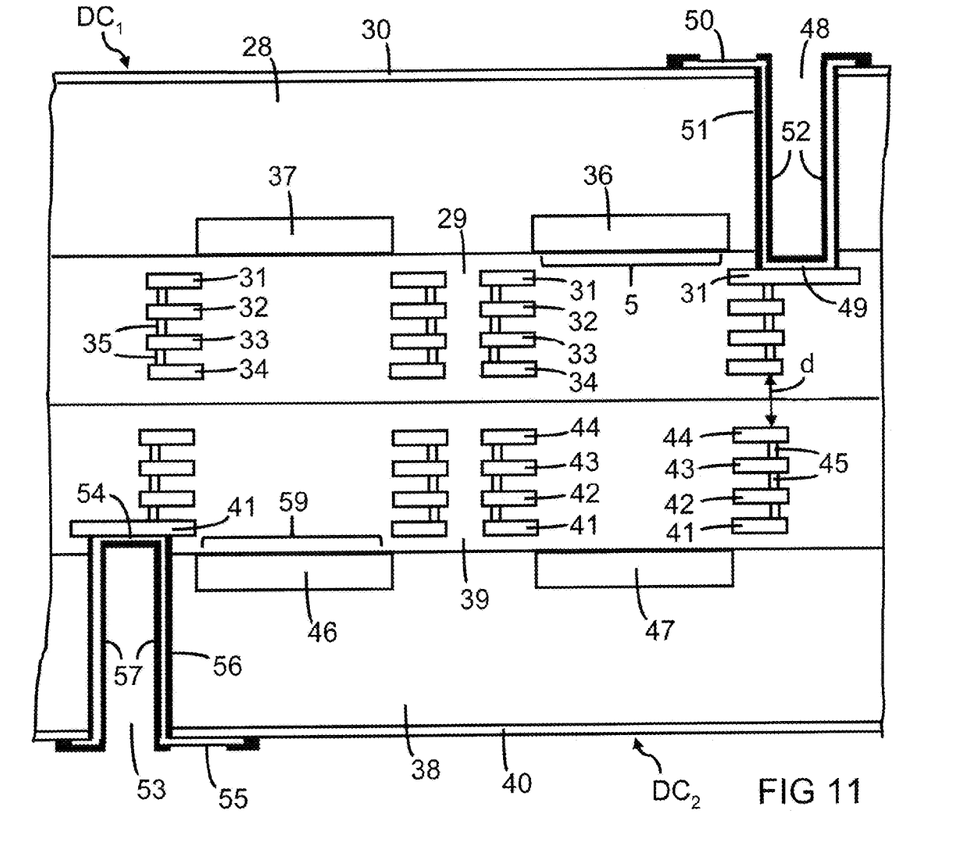
FIG. 11 is a partial cross section of a further stacked light emitting semiconductor device.

FIG. 11 is a partial cross section of a further stacked light emitting semiconductor device. Elements of the device according to FIG. 11 that correspond to elements of the device according to FIG. 8 are designated with the same reference numerals. In the device according to FIG. 11, the metallization levels 31, 32, 33, 34, 41, 42, 43, 44 are arranged in such a fashion that the solid angle of propagation of the emitted light is restricted and optical crosstalk between the device components $DC_1$, $DC_2$ is thus reduced. For this purpose the metallization levels 31, 32, 33, 34, 41, 42, 43, 44 are structured into portions having the same or essentially the same lateral dimensions. In both device components $DC_1$, $DC_2$ such portions are arranged one above another to form optical confinements along lateral boundaries of the light emitting areas 5, the light receiving areas 58 and/or arrays of light emitting areas 5 and arrays of light receiving areas 58. Such an optical confinement may also be provided for a single light emitting semiconductor device by a suitable arrangement of the metallization levels 31, 32, 33, 34.

The restriction of the solid angle of light propagation enables communication over several channels in parallel. For this purpose a plurality of bipolar light emitters and light detectors can be integrated in the stacked light emitting semiconductor device. The light emitting areas 5 and light receiving areas 58 provided for different channels are separated from one another by the optical confinements.

Figure 12:
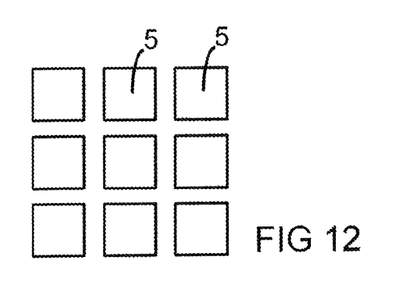
FIG. 12 is a further top view of the light emitting areas of the bipolar light emitters.
Figure 13:
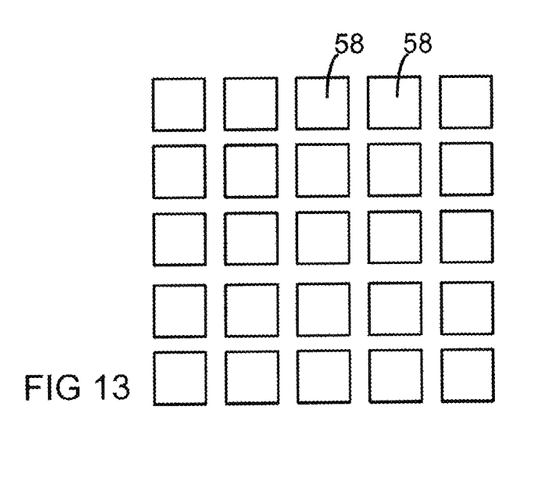
FIG. 13 is a further top view of areas of single-photon avalanche diodes.

FIG. 12 shows a further example of an array of individual light emitting areas forming the light emitting area 5 of the bipolar light emitter 36 of the first device component $DC_1$ and/or the light emitting area 59 of the bipolar light emitter 46 of the second device component $DC_2$. FIG. 13 shows a further example of an array of individual light receiving areas forming the light receiving area 58 of the light detector 37 of the first device component $DC_1$ and/or the light detector 47 of the second device component $DC_2$. In this further example, the array of light emitting areas 5 is smaller than the array of light receiving areas 58.

It is of advantage that the described light emitting semiconductor device can be produced in a standard CMOS process without any non-typical CMOS process steps or even without any modifications. A further advantage is that very short light pulses of less than 1 ns duration can be generated, and the duration of the light pulses does not depend on the circuit speed, in particular not on a clock frequency, a transistor switching speed or the like. The pulse repetition rate can be rather high (larger than typically 100

MHz) and can be optimized for conventional quenching components, including active quenching circuits, for instance. The described light emitting semiconductor device is self-protecting, since the avalanche is stopped by the quenching component. The light intensity can be tuned (especially increased) by an additional capacitor.

The invention claimed is:

1. A light emitting semiconductor device, comprising:
   a bipolar transistor with emitter, base, collector, base-collector junction and base-emitter junction,
   a collector-to-base breakdown voltage,
   a quenching component electrically connected with the base or the collector, and
   a switching circuitry configured to apply a forward bias to the base-emitter junction, the bipolar transistor being configured for operation at a reverse collector-to-base voltage above the breakdown voltage.

2. The light emitting semiconductor device of claim 1, wherein the switching circuitry is configured to enable an electric connection of the emitter alternatively with a ground potential and with a further voltage, which is provided for triggering an avalanche breakdown.

3. The light emitting semiconductor device of claim 1, further comprising:
   a first capacitor connected to the emitter, the switching circuitry being configured to enable the first capacitor to be charged to a capacitor voltage and to be discharged through the emitter for triggering an avalanche breakdown.

4. The light emitting semiconductor device according to claim 1, further comprising:
   a second capacitor connected in parallel with the quenching component.

5. The light emitting semiconductor device according to claim 1, further comprising:
   a third capacitor connected between the collector and the base.

6. The light emitting semiconductor device according to claim 1, wherein the quenching component comprises a resistor or a transistor.

7. The light emitting semiconductor device according to claim 1, wherein the quenching component is an active quenching circuit.

8. The light emitting semiconductor device according to claim 1, further comprising:
   a first device component including a bipolar light emitter, which is formed by the bipolar transistor, the quenching component and the switching circuitry, and a light detector, and
   a second device component including a further bipolar light emitter and a further light detector, the first and second device components being arranged so that the bipolar light emitter is opposite the further light detector and the further bipolar light emitter is opposite the light detector.

9. The light emitting semiconductor device of claim 8, further comprising:
   an intermetal dielectric forming part of the first device component, and
   metallization layers embedded in the intermetal dielectric, the metallization layers forming an optical confinement of a light emitting area of the bipolar light emitter.

10. The light emitting semiconductor device of claim 9, further comprising:
    a further intermetal dielectric forming part of the second device component, the intermetal dielectric being connected to the further intermetal dielectric, and
    further metallization layers embedded in the further intermetal dielectric, the further metallization layers forming a further optical confinement of a light receiving area of the further light detector.

11. The light emitting semiconductor device of claim 10, wherein:
    the metallization layers form a further optical confinement of a light receiving area of the light detector, and
    the further metallization layers form a further optical confinement of a further light emitting area of the further bipolar light emitter.

12. The light emitting semiconductor device according to claim 1, further comprising:
    a substrate of semiconductor material, the substrate having a main surface,
    a shallow well of a first type of conductivity in a deep well of an opposite second type of conductivity in the substrate,
    a doped region of the second type of conductivity in the shallow well at the main surface,
    a p-n junction between the doped region and the shallow well,
    a junction-forming region arranged in the deep well under the shallow well, the junction-forming region having a doping concentration for the second type of conductivity, the doping concentration of the junction-forming region being higher than a doping concentration of the deep well outside the junction-forming region, and
    a further p-n junction between the junction-forming region and the shallow well, the p-n junction and the further p-n junction forming a bipolar light emitter generating light pulses by a current or voltage across the p-n junction when the further p-n junction is reverse biased above a breakdown voltage.

13. The light emitting semiconductor device of claim 12, further comprising:
    a shallow well contact region of the first type of conductivity in the shallow well at the main surface,
    the shallow well contact region having a doping concentration that is higher than a doping concentration of the shallow well, and
    the doped region being arranged at a distance from the shallow well contact region.

14. The light emitting semiconductor device of claim 12, further comprising:
    a deep well contact region of the second type of conductivity in the deep well at the main surface, the deep well contact region having a doping concentration that is higher than a doping concentration of the deep well.

* * * * *